(12) United States Patent
Hwang et al.

(10) Patent No.: US 6,703,657 B2
(45) Date of Patent: Mar. 9, 2004

(54) DRAM CELL HAVING ELECTRODE WITH PROTECTION LAYER

(75) Inventors: Yoo-Sang Hwang, Kyunggi-do (KR); Byung-Jun Park, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/189,737

(22) Filed: Jul. 8, 2002

(65) Prior Publication Data

US 2002/0167036 A1 Nov. 14, 2002

Related U.S. Application Data

(62) Division of application No. 09/702,795, filed on Nov. 1, 2000, now Pat. No. 6,489,195.

(30) Foreign Application Priority Data

Nov. 5, 1999 (KR) .............................................. 99-48926

(51) Int. Cl.[7] .............................................. H01L 27/108
(52) U.S. Cl. .......................... 257/296; 438/326; 438/24; 438/306
(58) Field of Search ................................. 257/296, 306, 257/326, 330, 211, 300–303; 438/238, 239, 386, 399, 589, 244, 253, 387, 396, 258, 266, 590

(56) References Cited

U.S. PATENT DOCUMENTS 5,597,756 A      1/1997   Fazan et al.
5,907,772 A   *  5/1999   Iwasaki ...................... 438/253

* cited by examiner

Primary Examiner—Carl Whitehead, Jr.
Assistant Examiner—Yennhu B Huynh
(74) Attorney, Agent, or Firm—Volentine Francos, PLLC (57) ABSTRACT

A DRAM cell is provided, along with a method for fabricating such a DRAM cell. A protection layer pattern is formed to cover a common drain region of first and second access transistors. Storage node holes are then formed to expose each source region of the first and second access transistors, by using an etching insulator that has an etching selectivity with respect to the protection layer. Accordingly, even if there is a misalignment of the storage node holes to the source regions, the common drain region is not exposed by the misaligned storage node holes because of the presence of the protection layer pattern.

11 Claims, 12 Drawing Sheets

DRAM CELL HAVING ELECTRODE WITH PROTECTION LAYER

CROSS REFERENCE TO RELATED APPLICATIONS

This is a divisional application of application Ser. No. 09/702,795, filed Nov. 1, 2000, which is hereby incorporated by reference in its entirety for all purposes, now U.S. Pat. No. 6,489,195.

This application relies for priority upon Korean Patent Application No. 99-48926, filed on Nov. 5, 1999, the contents of which are herein incorporated by reference in their entirety.

BACKGROUND OF THE INVENTION

The present invention relates to a semiconductor memory device and a method for fabricating such a device. More particularly, the present invention relates to a DRAM cell and a method for fabricating such a DRAM.

Semiconductor memories are considered one of the crucial microelectronics components for mainframe computers, PCs, telecommunications, automotive and consumer electronics, and commercial and military avionics systems. Semiconductor memory devices can be characterized as either volatile random access memory devices (RAMs) or non-volatile memory devices (NVMs). RAMs can further include dynamic RAMs (DRAMs) and static RAMs (SRAMs). As is well known, DRAMs have about four times as high a degree of integration compared to SRAMs. Because of this, DRAMs have been widely used in computer main memories.

DRAMs are composed of a cell array region that has a plurality of memory cell arrays, and a peripheral circuit region that controls and drives the memory cell arrays. Each memory cell typically consists of a cell storage capacitor and an access transistor. Either the source or drain of the access transistor is connected to one terminal of the cell capacitor. The properties of the cell storage capacitor directly affects the characteristics of the DRAM, such as data retention, soft error rate, low voltage performance, or the like. In particular, a higher capacitance of the cell capacitor improves the data retention characteristics and low voltage characteristics, and reduces the soft error rate of the DRAM. Accordingly, in order to realize high density DRAM devices, the cell capacitor is formed to have an acceptable level of capacitance in a given cell.

U.S. Pat. No. 5,597,756 by Fazan et al entitled as "PROCESS FOR FABRICATING A CUP-SHAPED DRAM CAPACITOR USING A MULTI-LAYER PARTIALLY-SACRIFICIAL STACK", the disclosure of which is incorporated herein by reference, discloses a capacitor storage node having HSG silicon layer on its surface. Also, U.S. Pat. No. 5,907,772 by Iwazaki entitled as "METHOD FOR PRODUCING CYLINDRICAL STORAGE NODE OF STACKED CAPACITOR IN MEMORY CELL", the disclosure of which is incorporated herein by reference, discloses a planarized interlayer insulating layer formed on a semiconductor substrate. The semiconductor substrate has an access transistor and a cylindrical storage node formed on the planarized interlayer insulating layer, which is electrically connected to a source region of the access transistor.

Figure 1:
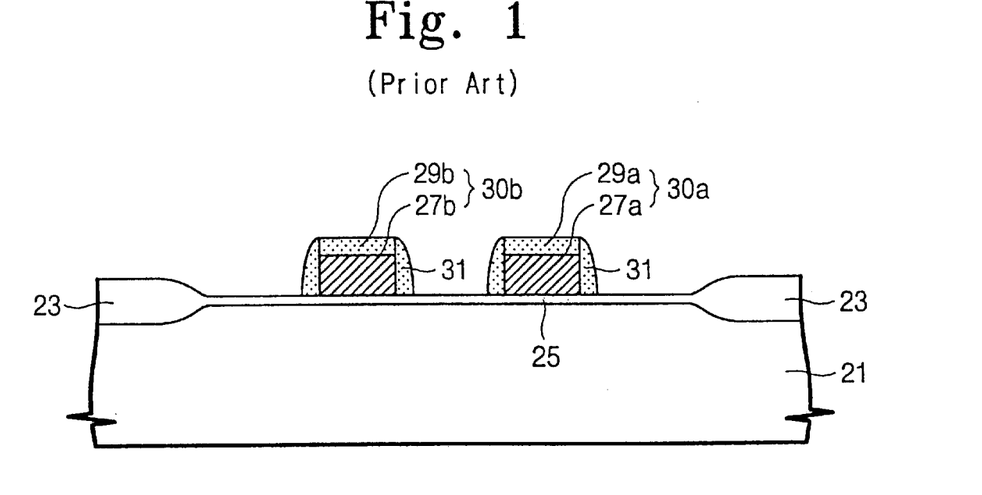
FIGS. 1 to 5 are cross-sectional views of a semiconductor substrate, at selected stages of a conventional method for fabricating a DRAM cell.

FIGS. 1 to 5 are cross-sectional views of a conventional semiconductor substrate, at selected stages of a DRAM fabrication process. Referring to FIG. 1, a device isolation region 23 is formed in a predetermined region of a semiconductor substrate 21 to define an active region. A gate oxide layer 25 is formed on the active region. Doped polysilicon and a silicon nitride layers are sequentially formed on the resulting structure. The doped polysilicon and the silicon nitride layers are patterned to form a first and a second gate patterns 30a and 30b, intersecting the active region and neighbouring each other. The first gate pattern 30a comprises a stacked layer of a first polysilicon pattern 27a and a first silicon nitride layer pattern 29a. Similarly, the second gate pattern 30b comprises a stacked layer of a second polysilicon pattern 27b and a second silicon nitride layer pattern 29b. The first and second polysilicon patterns 27a and 27b respectively serve as a gate electrode of neighbouring access transistors.

A silicon nitride layer is formed on the entire surface of the semiconductor substrate 21 having the first and second gate patterns 30a and 30b and is then anisotropically etched to form a side wall spacer 31 on side walls of the first and second gate patterns 30a and 30b.

Figure 2:
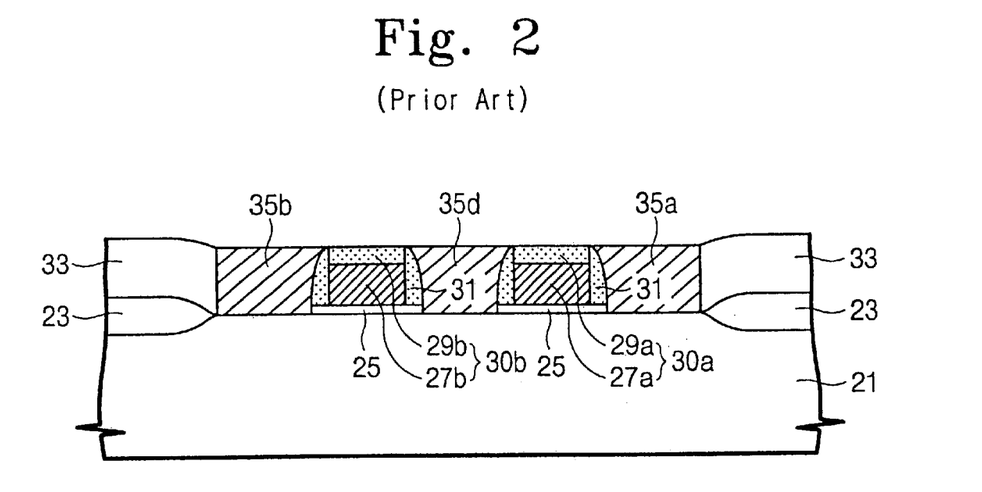

Referring now to FIG. 2, an insulating layer 33, such as a CVD oxide layer, is formed on the resulting structure. Selected portions of the insulating layer 33 are then etched to form pad contact holes that respectively expose the active regions outside of the first and second gate patterns 30a and 30b. A contact hole, defined between the first and second gate patterns 30a and 30b, is a bit line pad contact hole. Contact holes outside of the bit line pad contact hole are respectively first and second storage node pad contact holes, respectively. A bit line pad 35d and first and second storage node pads 35a and 35b are formed by respectively filling the bit line pad contact hole and the first and second storage node pad contact holes with a conductive material.

Figure 3:
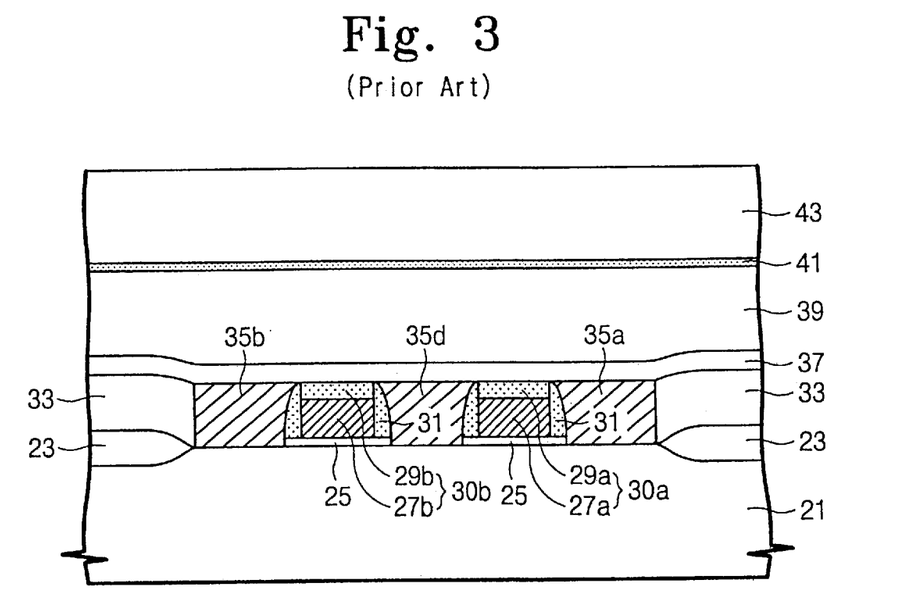

Referring now to FIG. 3, a first interlayer insulating layer 37, such as a CVD oxide, is formed on the resulting structure. A selected portion of the first interlayer insulating layer 37 is then etched to form a bit line contact hole (not shown), which exposes the bit line pad 35d. The bit line contact hole is then filled with a conductive material to form a bit line (not shown). A second interlayer insulating layer 39, an etching stopper layer 41, and a sacrificial insulating layer 43 are then sequentially formed on the first interlayer insulating layer 37 including the bit line. The second interlayer insulating layer 39 comprises a CVD oxide layer planarized by CMP process. The etching stopper layer 41 comprises a material having an etching selectivity with respect to an oxide, such as a silicon nitride layer. The sacrificial insulating layer 43 comprises a CVD oxide.

Figure 4:
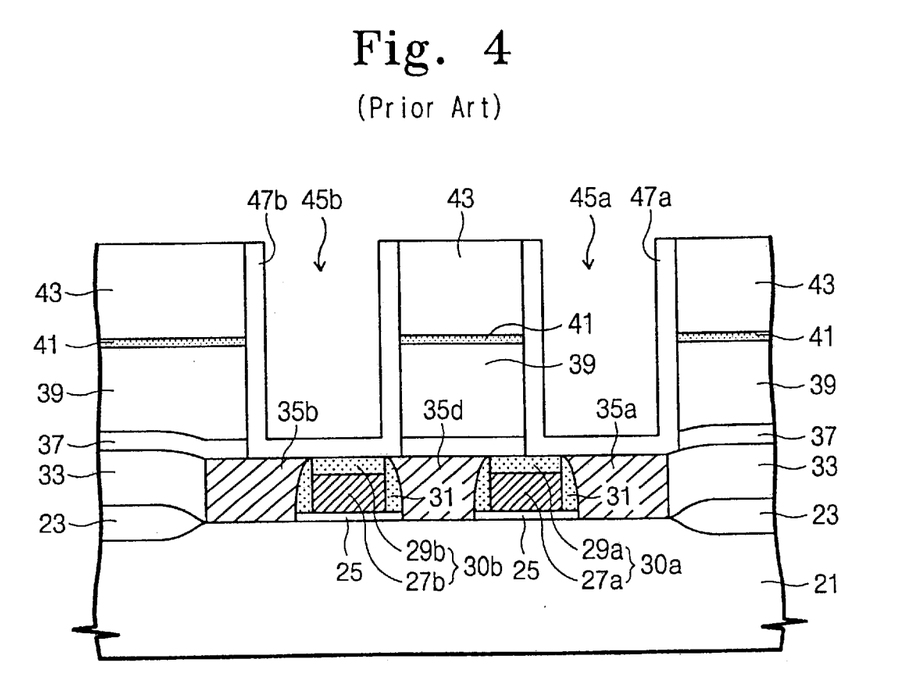

Referring now to FIG. 4, the sacrificial insulating layer 43, the etching stopper layer 41, the second interlayer insulating layer 39, and the first interlayer insulating layer 37 are sequentially patterned to form first and second storage node holes 45a and 45b, respectively exposing the first and second storage node pads 35a and 35b. At this time, the first and second storage nodes holes 45a and 45b can be misaligned to the storage node pads 35a and 35b, thereby exposing the bit line pad 35d, as shown in FIG. 4.

A conformal conductive layer is deposited on the sacrificial insulating layer 43 and in the holes 45a and 45b to form first and second cylindrical storage nodes 47a and 47b. As noted above, in the case of a misalignment of the first and second storage node holes 45a and 45b, one of the first and second storage nodes 47a and 47b, for example, the second storage node 47b, becomes electrically connected to the bit line pad 35d.

Figure 5:
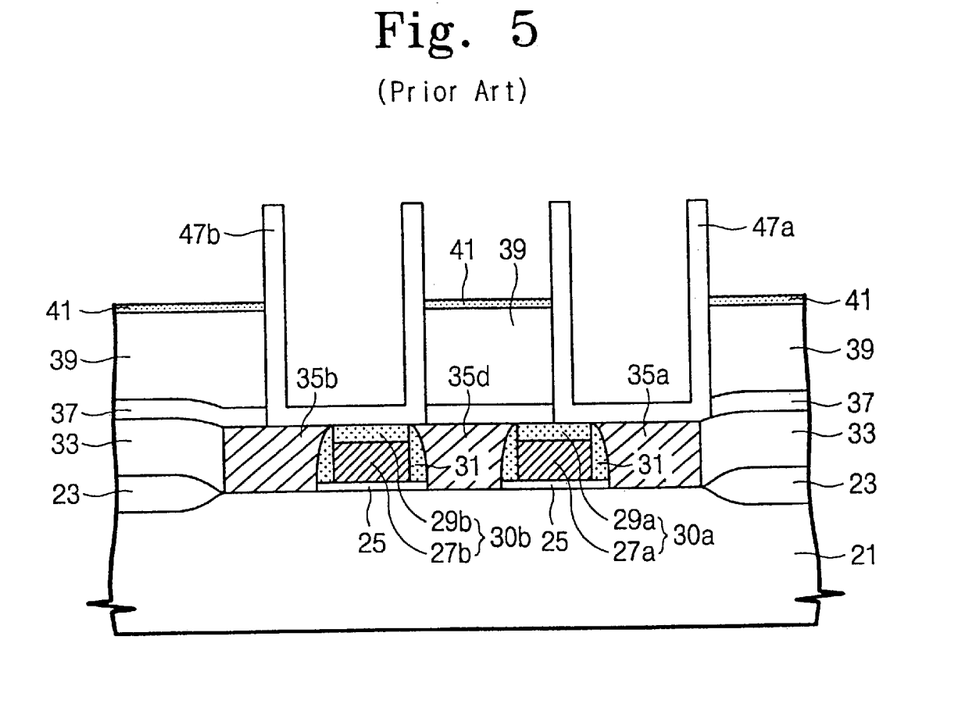

Referring to FIG. 5, the sacrificial insulating layer 43 is etched to expose outer sidewalls of the first and second cylindrical storage nodes 47a and 47b. The etching stopper layer 41 serves as an end-point of the etching and thus the second interlayer insulating layer 39 is not exposed.

As described above, when misalignment occurs during a photolithography process for forming storage node holes, the storage node and the bit line pad may be electrically connected, causing a malfunction of the fabricated DRAMs.

SUMMARY OF THE INVENTION

The present invention was made in view of above-mentioned problems and it is an object of the present invention to provide a method of fabricating a DRAM cell that can prevent bit line pad from being exposed by the storage node hole even when there is misalignment of the storage node hole during a photolithography process.

It is another object of the present invention to provide a method of fabricating a high performance cell capacitor compatible with high density DRAMs.

It is still another object of the present invention to provide a DRAM cell in which the storage node and the bit line pad are electrically separated even when there is misalignment of the storage node hole to the bit line.

In accordance with the present invention, a method is provided for fabricating a cylindrical capacitor. The method includes forming first and second access transistors that share a common drain region over a semiconductor substrate. A first interlayer insulating layer is formed on the semiconductor substrate and the first and second access transistors. A protection layer pattern is provided that completely covers the common drain region on the first interlayer insulating layer. An insulator is formed over the first interlayer insulating layer and the protection layer pattern. The insulator includes a second interlayer insulating layer. The insulator and the first interlayer insulating layer are sequentially patterned to form first and second storage node holes, respectively exposing a first source region of the first access transistor and a second source region of the second access transistor. First and second storage nodes are formed in the first and second storage node holes, respectively.

The forming of the first and the second access transistors may be performed by forming a device isolation layer over a selected portion of the semiconductor substrate to define a primary active region; forming first and second insulated gate patterns crossing over the primary active region to divide the primary active region into first and third active regions; forming sidewall spacers on sidewalls of the first and second gate patterns; and forming the common drain region at the first active region between the first and second gate patterns, and the first and the second source regions at the second and third active regions next to the first and second insulated gate patterns, respectively.

The method for fabricating a DRAM cell may further include forming a bit line pattern between the protection layer pattern and the common drain region.

The forming of the protection layer pattern may be performed by forming the protection layer over the first interlayer insulating layer and over the bit line pattern; forming a photoresist pattern over the protection layer to cover the common drain region and expose the first and second source regions; and anisotropically etching the protection layer using the photoresist pattern as an etching mask to form the protection layer pattern completely covering bit line pattern over the common drain region, while concurrently forming sidewall spacers on sidewalls of the bit line pattern exposed by the protection layer pattern.

The method for fabricating a DRAM cell may further include forming a first storage node pad interposed between the first storage node and the first source region of the first access transistor; forming a second storage node pad interposed between the second storage node and the second source region of the second access transistor; and forming a bit line pad interposed between the bit line pattern and the common drain region.

The forming of the insulator may include forming the second interlayer insulating layer over the first interlayer insulating layer and the protection pattern; forming an etching stopper layer over the second interlayer insulating layer; and forming a sacrificial insulating layer over the etching stopper layer.

The first interlayer insulating layer, the second interlayer insulating layer, and the sacrificial insulating layer preferably comprise silicon oxide. The protection layer and the etching stopper layer preferably comprise silicon nitride.

The forming of the first and second storage nodes may be performed by forming a conformal conductive layer over the sacrificial insulating layer and in the first and second storage node holes; forming a planarized insulator filling the first and second storage node holes over the conformal conductive layer; and blanket etching the planarized insulator and the conformal conductive layer until a top surface of the sacrificial insulating layer is exposed.

The method for fabricating a DRAM cell may include removing the exposed sacrificial insulating layer and the remainder of the planarized insulator in the first and second storage node holes, to expose outer and inner sidewalls of each of the first and second storage node, respectively; forming a dielectric layer over the etching stopper layer and the storage nodes; and forming a plate electrode layer over the dielectric layer.

To achieve these objectives and in accordance with the present invention, a DRAM cell is provided. The DRAM cell includes first and second access transistors formed over a semiconductor substrate, the first and second access transistors sharing a common drain region and having first and second source regions, respectively; first and second storage nodes electrically connected to the first and second source regions, respectively; and a protection layer pattern disposed between the common drain region and the first and second storage nodes, the protection layer pattern completely covering the common drain region.

The DRAM cell may further include a bit line pad formed over the common drain region; a first storage node pad formed over the first source region; and a second storage node pad formed over the second source region. The first and second storage nodes are electrically connected to the first and second source regions, respectively. Also, the bit line pad is electrically connected to the common drain region.

The DRAM cell may further include a bit line pattern disposed between the bit line pad and the protection layer pattern, the bit line pattern being electrically connected to the bit line pad.

The protection layer pattern may be extended to cover not only a part of the bit line pattern over the common drain region, but also a part of the first and second gate patterns of the first and second access transistors adjacent to the common drain region.

The DRAM cell may further include a first interlayer insulating layer disposed between the protection layer pattern and the first and second gate patterns of the first and second access transistors, respectively.

The protection layer pattern preferably has an etching selectivity with respect to the first interlayer insulating layer.

The first interlayer insulating layer preferably comprises silicon oxide and the protection layer pattern preferably comprises silicon nitride.

As described above, in accordance with the present invention, the common drain region, the bit line pad or bit line pattern are not exposed by the storage nodes hole because of the presence of a protection layer pattern that has an etching selectivity with respect to the first and second interlayer insulating layers.

BRIEF DESCRIPTION OF THE DRAWINGS

The above features and advantages of the invention will become apparent upon reference to the following detailed description of specific embodiments and the attached drawings, of which:

FIGS. 7A to 12A are cross-sectional views of a semiconductor substrate, taken along line I—I' of FIG. 6, at selected stages of a method for fabricating a DRAM cell according to a preferred embodiment of the present invention;

FIGS. 7B to 12B are cross-sectional views of a semiconductor substrate, taken along line II—II' of FIG. 6, at selected stages of a method for fabricating a DRAM cell according to a preferred embodiment of the present invention.

DETAILED DESCRIPTION OF THE PREFERRED EMBODIMENT

The present invention will now be described more fully below with reference to the accompanying drawings, in which a preferred embodiments of the invention is shown. In the drawings, the thickness of layers and regions are exaggerated for clarity. It will also be understood that when a layer is referred to as being "on" another layer or substrate, it can be directly on the other layer or substrate or intervening layers may also be present. Moreover, each embodiment described and illustrated below includes its complementary conductivity type embodiment as well as the conductivity type disclosed.

Figure 6:
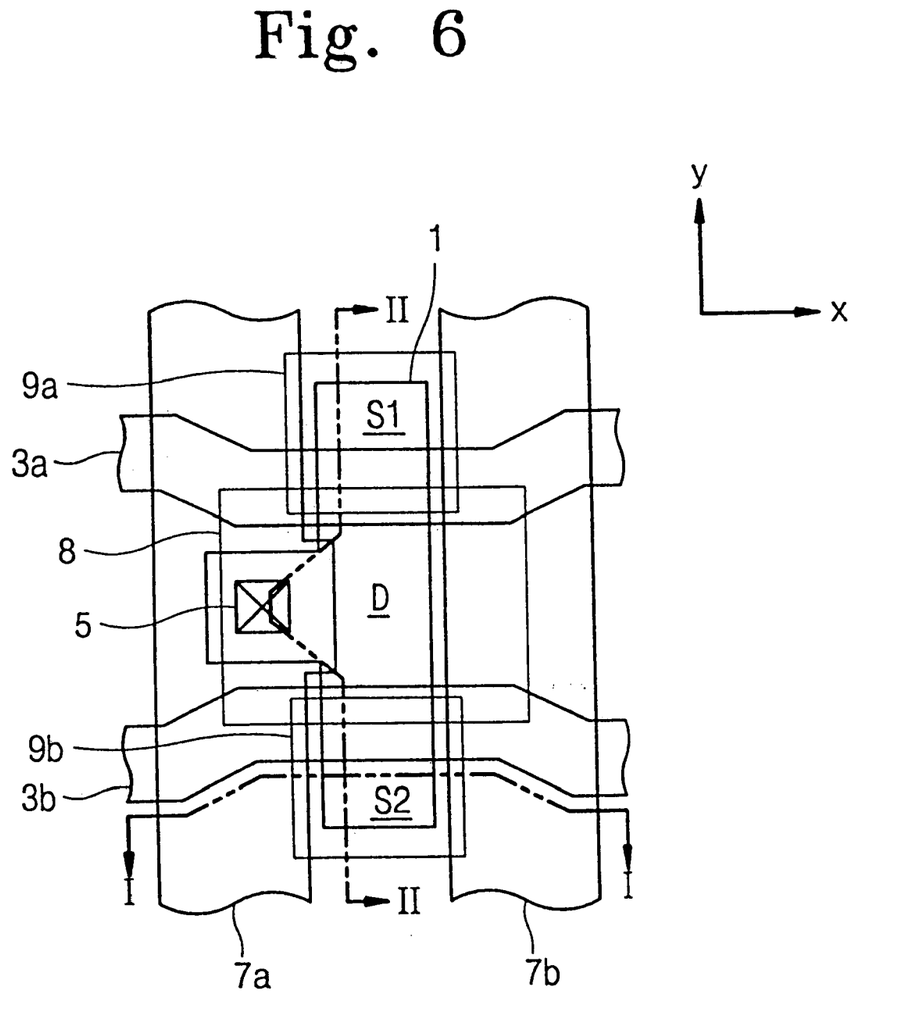
FIG. 6 schematically illustrates a layout diagram for DRAM cell in accordance with a preferred embodiment of the present invention.

FIG. 6 schematically shows a part of a layout diagram for a DRAM cell according to a preferred embodiment of the present invention. Referring to FIG. 6, a pair of word line patterns, i.e. a first word line 3a and a second word line 3b intersect at an active region 1 defined at a predetermined portion of a semiconductor substrate, along the x-axis. Accordingly, the active region 1 is divided into three parts, a common drain region D, and first and second source regions $S_1$ and $S_2$.

The common drain region D is formed at the active region between the pair of the word line patterns. The first and second source regions $S_1$ and $S_2$ are formed at the active region outside of the common drain region D. The first word line pattern 3a, the common drain region D and the first source region $S_1$ comprise a first access transistor. Likewise, the second word line pattern 3b, the common drain region D and the second source region $S_2$ comprise a second access transistor.

A bit line contact hole pattern 5 is disposed over a predetermined portion of the common drain region D. A pair of bit line patterns, i.e., a first bit line pattern 7a and a second bit line pattern 7b intersect the pair of the word line patterns 3a and 3b at both sides of the active region 1, along the Y-axis. The first bit line pattern 7a is electrically connected to the common drain region D via the bit line contact hole pattern 5. Though not shown in the current layout, the second bit line pattern 7b is electrically connected to another common drain region D via another bit line contact hole pattern.

A protection layer pattern 8 is disposed to cover completely the common drain region D. More particularly, the protection layer pattern 8 preferably extends to cover not only a part of the first bit line pattern 7a but also a part of the first and second word line patterns 3a and 3b, neighbouring the common drain region D. Preferably, the first and second source regions $S_1$ and $S_2$ are exposed by the protection layer pattern 8. This is because storage node holes are to be open to the first and second source regions $S_1$ and $S_2$. A first storage node hole pattern 9a is disposed over the first source region $S_1$ to expose the first source region $S_1$. Likewise a second storage hole pattern 9b is disposed on the second source region $S_2$ to expose the second source region $S_2$.

FIGS. 7A to 12A are cross-sectional views of a semiconductor substrate, taken along line I—I' of FIG. 6, at selected stages of a preferred method for fabricating a DRAM cell. FIGS. 7B to 12B are cross-sectional views of a semiconductor substrate, taken along line II—II' of FIG. 6, at selected stages of the preferred method for fabricating a DRAM cell. Now, the formation of a DRAM cell by using the mask pattern schematically shown in FIG. 6 will be fully described.

Figure 7A:
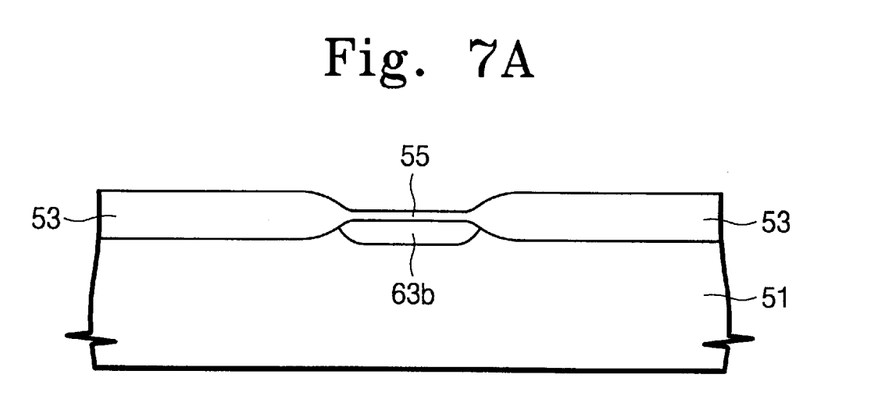
Figure 7B:
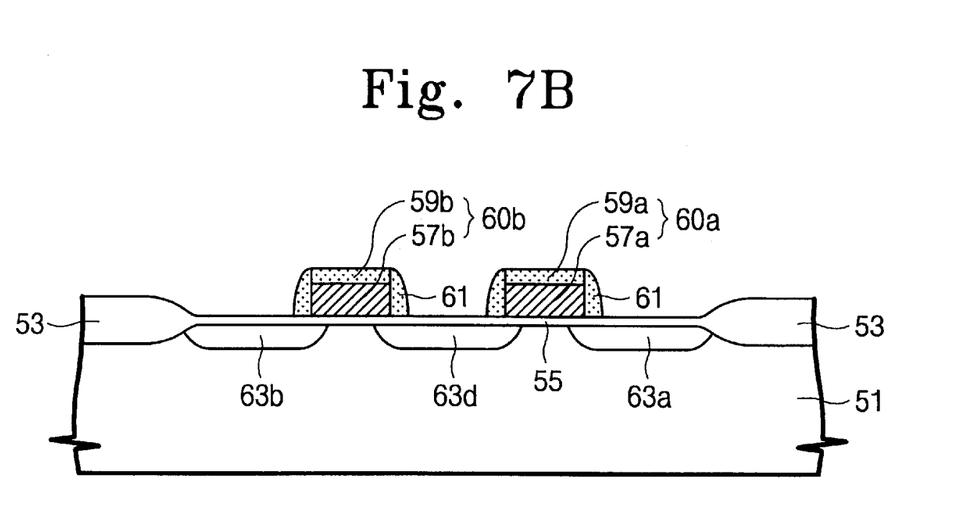

Referring to FIGS. 7A and 7B, a photo mask is used to define the active region pattern 1 of FIG. 6, and a device isolation layer 53 is formed on a predetermined portion of a semiconductor substrate 51. The device isolation layer 53 may be formed by a well-known LOCOS technique or by an STI technique. A gate insulating layer 55, such as a thermal oxide layer, is then formed on the active portion of the semiconductor substrate defined by the device isolation region 53. Conductive layers to be used for a gate electrode and an insulating layer to be used for a gate capping layer are sequentially formed on the resulting structure. The conductive layer used for a gate electrode preferably comprises a polysilicon layer and polycide layer. The insulating layer used for a gate capping layer comprises a material layer that has an etching selectivity with respect to a silicon oxide layer, such as a silicon nitride layer.

Using a photo mask defining the word line patterns 3a and 3b of FIG. 6, the gate capping layer and the gate conductive layer are sequentially patterned to form first and second gate patterns 60a and 60b that intersect the active region. The first gate pattern 60a comprises a stacked layer of a first gate electrode 57a and a first gate capping layer pattern 59a. Similarly, the second gate pattern 60b comprises a stacked layer of a second gate electrode 57b and a second gate capping layer pattern 59b. Each gate electrode serves as a word line in the DRAM cell.

A spacer insulating layer that has an etching selectivity with respect to the silicon oxide, is then formed on the resulting structure having the gate patterns 60a and 60b. Preferably the spacer insulating layer comprises the same material as the gate capping layer, i.e., silicon nitride. The spacer insulating layer is then anisotropically etched to form a gate spacer 61 on sidewalls of the first and second gate patterns 60a and 60b.

Impurities of an opposite conductivity type to the substrate 51 are then implanted into the substrate 51 using the gate patterns 60a and 60b, gate spacer 61, and the device isolation region 53 as ion implantation masks, to form impurities diffusion regions. More particularly, an impurity diffusion region formed between the first and second gate patterns 60a and 60b, is a common drain region 63d. An impurity diffusion region formed outside of the common drain region 63d and neighbouring the first gate pattern 60a is a first source region 63a. Similarly, an impurity diffusion region formed outside of the common drain region 63d and neighbouring the second gate pattern 60b is a second source region 63b. Prior to the formation of the spacer insulating layer, impurities can be implanted into the substrate using the gate patterns 60a and 60b and the device isolation region 53 as ion implantation masks. This implantation process is preferably performed with a low dose of about $1 \times 10^{13}$ ion atoms/cm$^2$ to form a lightly doped drain (LDD) region.

Elements 63a, 63b, and 63d correspond to elements $S_1$, $S_2$, and D in FIG. 6. Similarly, elements 57a and 57b correspond to elements 3a and 3b in FIG. 6.

The first gate electrode 57a, the first source region 63a, and the common drain region 63d comprise a first access transistor. Likewise, the second gate electrode 57b, the second source region 63b, and the common drain region 63d comprise a second access transistor.

Figure 8A:
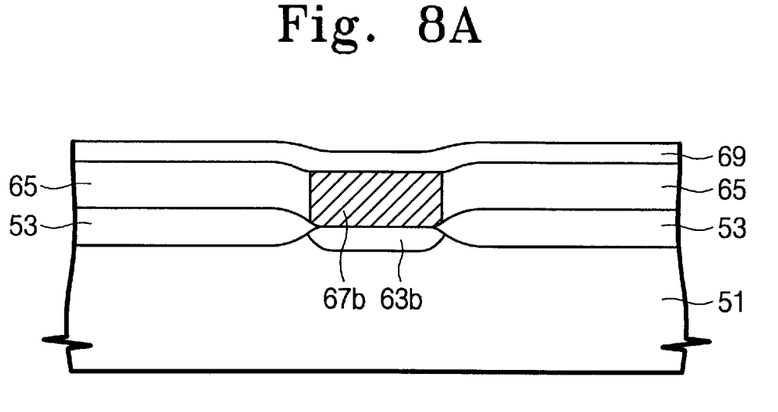
Figure 8B:
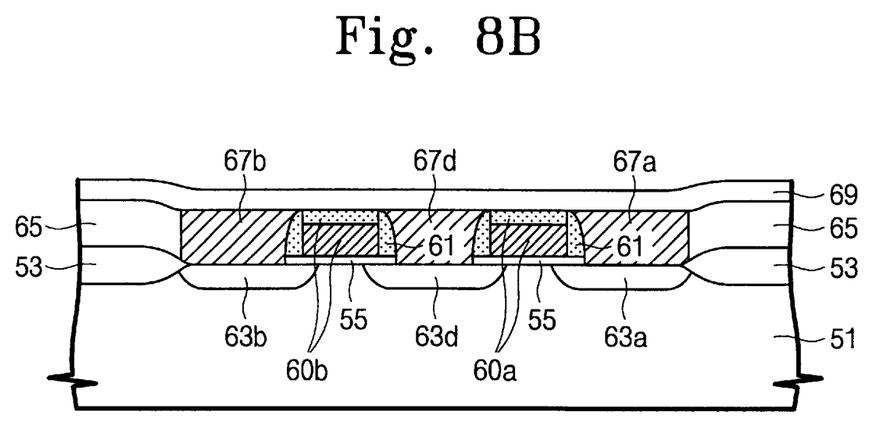

Referring now to FIGS. 8A and 8B, an insulating layer 65 is formed on the resulting structure having the first and second access transistors. The insulating layer 65 preferably comprises a material that has an etching selectivity with respect to the gate capping layer 59a and 59b and sidewall spacer 61, such as a CVD silicon oxide. The insulating layer 65 is patterned to form holes that expose the common drain region 63d, the first source region 63a, and the second source region 63b. A pad conductive layer is then preferably formed on the insulating layer 65 to fill the holes.

A planarization process is carried on the pad conductive layer until the insulating layer 65 and capping layer patterns 59a and 59b are exposed. This results in the formation of a bit line pad 67d, a first storage node pad 67a, and a second storage node pad 67b, on the common drain region 63d, the first source region 63a, and the second source region 63b, respectively. A first interlayer insulating layer 69 such as CVD oxide layer is then preferably deposited over the resulting stricture having the pads.

Figure 9A:
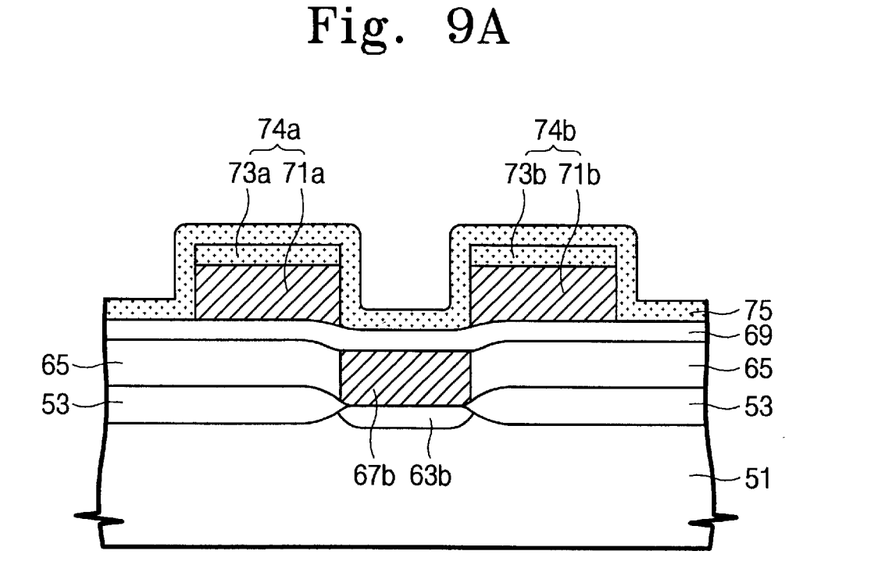
Figure 9B:
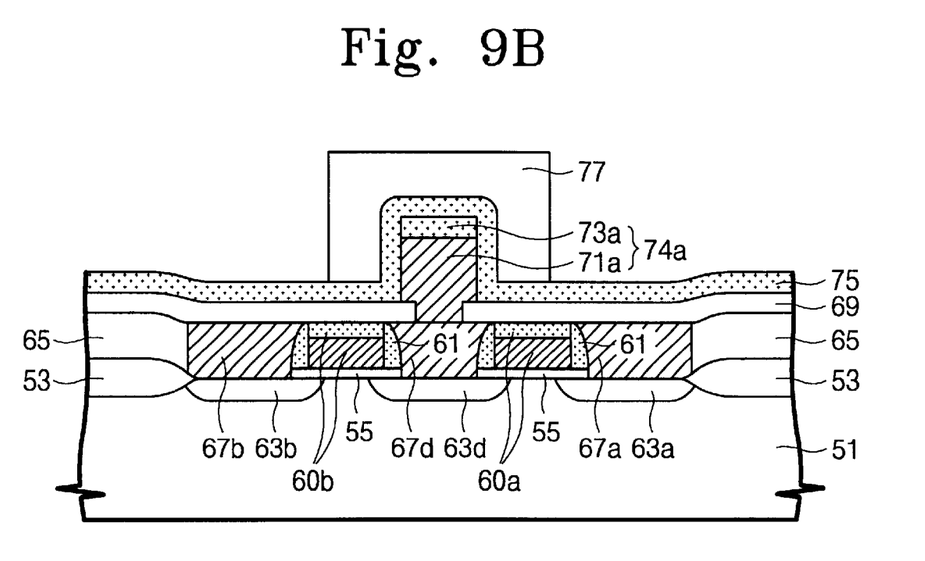

Referring now to FIGS. 9A and 9B, the first interlayer insulating layer 69 is patterned to form a bit line contact hole that exposes the bit line pad 67d, using a photo mask that defines the bit line contact pattern 5 shown in FIG. 6. If the process for making the bit line pad 67d is omitted, the bit line contact hole directly exposes the common drain region 63d. A bit line conductive layer and a bit line capping layer are sequentially formed on the first interlayer insulating layer 69 to fill the bit line contact hole. The bit line conductive layer preferably comprises a polysilicon layer and a refractory metal silicide layer. The bit line capping layer preferably comprises a material layer that has an etching selectivity with respect to a silicon oxide layer, e.g. silicon nitride.

The bit line capping layer and the bit line conductive layer are sequentially patterned using a photo mask that defines the bit line patterns 7a and 7b of FIG. 6, to thereby form bit line patterns, i.e., a first bit line pattern 74a and a second bit line pattern 74b. Accordingly, the first bit line pattern 74a preferably comprises a stacked layer of a first bit line 71a and a first bit line capping layer pattern 73a. Similarly, the second bit line pattern 74b preferably comprises a stacked layer of a second bit line 71b and a second bit line capping layer pattern 73b.

Elements 71a and 71b correspond to elements 7a and 7b in FIG. 6.

The fist bit line 71a is electrically connected to the bit line pad 67d via the corresponding bit line contact hole. Though not shown in the drawings, the second bit line 71b is electrically connected to another bit line pad via another bit line contact hole.

A protection layer 75 is formed on the bit line patterns 74a and 74b and on the first interlayer insulating layer 69. The protection layer 75 preferably comprises a material that has an etching selectivity with respect to a silicon oxide layer, such as silicon nitride. A photoresist pattern 77 that defines the protection layer pattern 8 of FIG. 6 is formed on the protection layer 75. As can be seen in layout diagram of FIG. 6, the photoresist pattern 77 is formed over the common drain region 63d. It is noted that the photoresist pattern 77 should expose first and second source regions 63a and 63b.

Figure 10A:
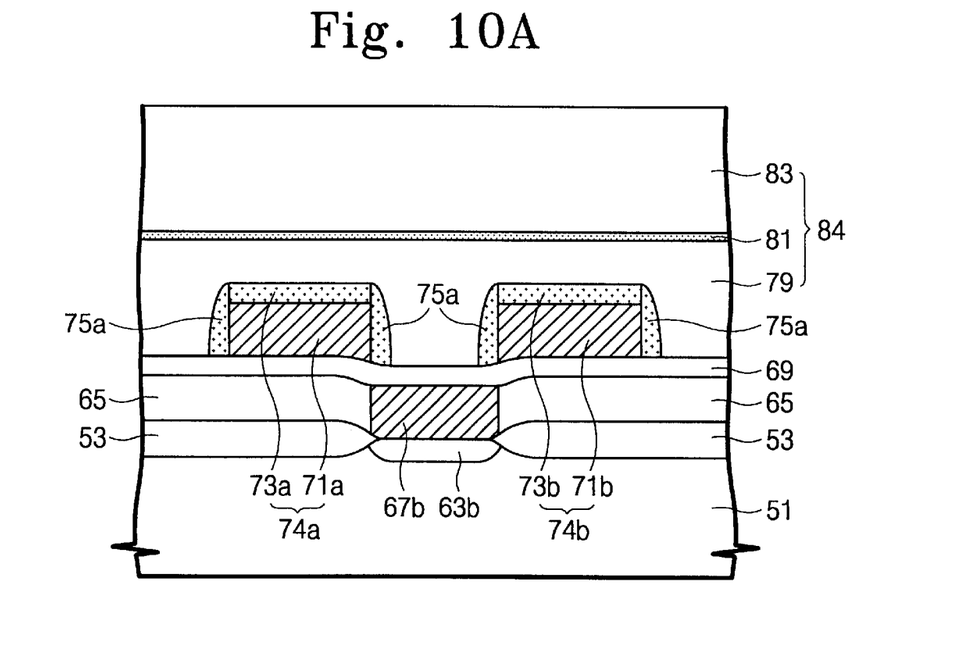
Figure 10B:
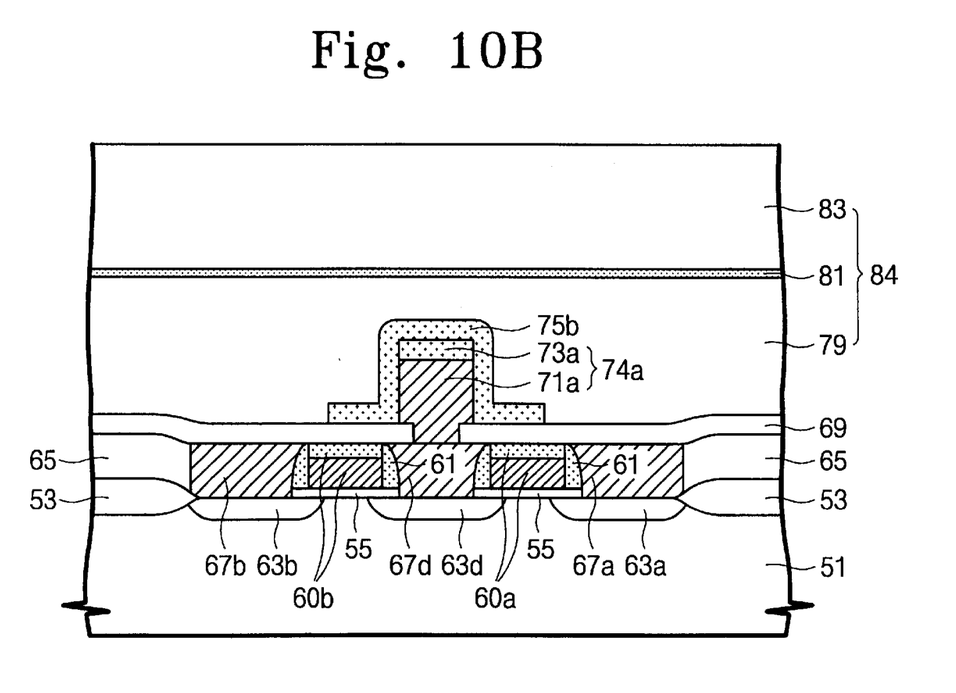

Referring now to FIGS. 10A and 10B, using the photoresist pattern 77 as an etching mask, the protection layer 75 is then patterned to form a protection layer pattern 75b. The protection layer pattern 75b covers the common drain region 63d. Accordingly, the bit line pattern formed over the common drain region 63d, i.e., the first bit line pattern 74a, is completely covered with the protection layer pattern 75b as shown in FIG. 10B.

The patterning of the protection layer pattern 75b is preferably performed using an anisotropic etching process. Accordingly, the bit line patterns 74a and 74b exposed by the photoresist pattern 77 have sidewall spacers 75a formed on their sidewalls, as shown in FIG. 10A. As a result, each bit line can be completely protected by either the protection layer pattern 75b, or capping layer pattern 73a/73b and sidewall spacer 75a. Furthermore, the common drain region 63d or bit line pad 67d electrically connected thereto are completely covered with the protection layer pattern 75b.

Element 75b corresponds to element 8 in FIG. 6.

An insulator 84 including a second interlayer insulating layer is formed on the resulting structure having the protection layer pattern 75b and the sidewall spacer 75a. More particularly, the insulator 84 preferably comprises a stacked layer of the second interlayer insulating layer 79, an etching stopper layer 81, and a sacrificial insulating layer 83. The second interlayer insulating layer 79 may comprise a planar BPSG layer.

Specifically, the BPSG layer may be deposited and an annealing process carried out to flow the deposited BPSG layer, thereby improving the step coverage. The annealing process is preferably performed at a temperature of about 850° C. to 900° C. Then a CMP process is carried out to planarize its surface. Alternatively, a CVD oxide can be deposited and then planarized by a CMP process. The etching stopper layer 81 preferably comprises a material that has an etching selectivity with respect to silicon oxide layer, e.g., silicon nitride. The sacrificial insulating layer 83 preferably comprises a CVD oxide layer.

Figure 11A:
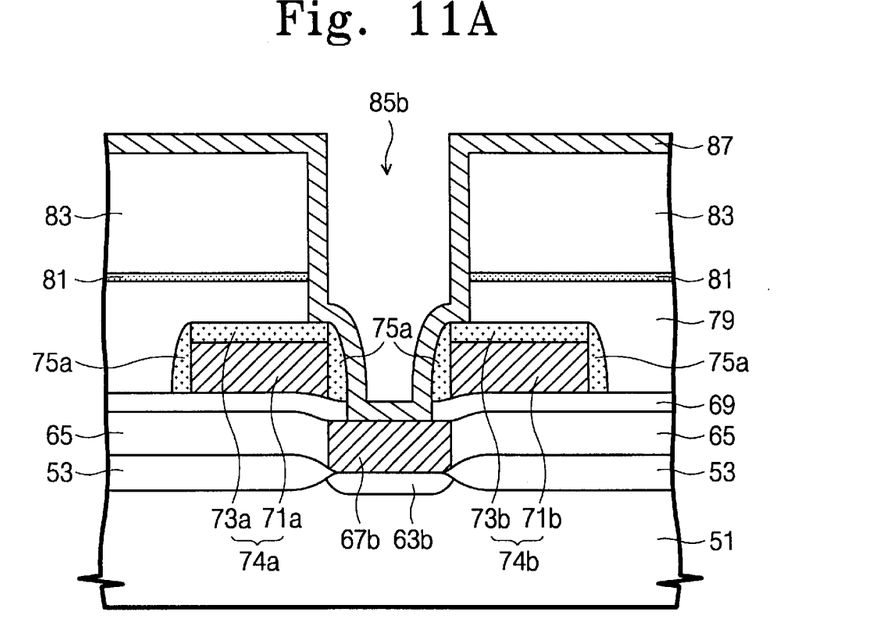
Figure 11B:
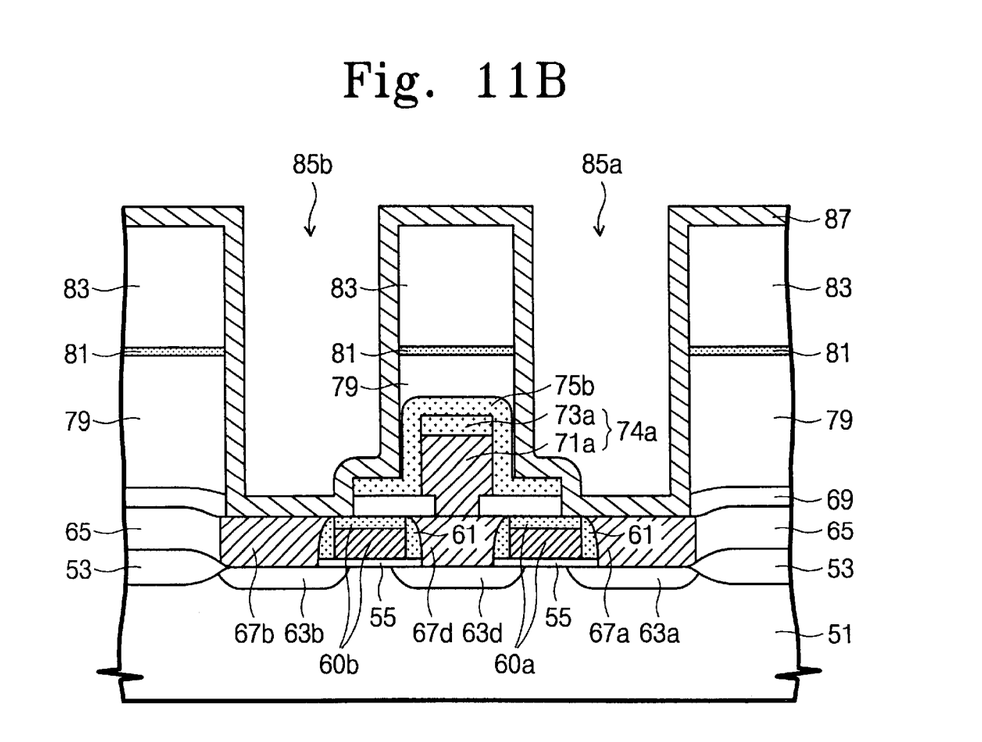

Referring now to FIGS. 11A and 11B, the sacrificial insulating layer 83, the etching stopper layer 81, the second interlayer insulating layer 79, and the first interlayer insulating layer 69 are sequentially etched to form first and second storage node holes 85a and 85b, using a photo mask that defines first and second storage node hole patterns 9a and 9b of FIG. 6. The first and second storage node holes 85a and 85b respectively expose the first storage node pad 63a and the second storage node pad 63b. Since the protection layer pattern 75b and the sidewall spacer 75a each have an etching selectivity with respect to the first and second interlayer insulating layers 69 and 79, the exposure of the bit lines 71a and 71b by the storage node holes 85a and 85b can be avoided. In particular, since the protection layer pattern 75b covers the common drain region 63d and the bit line pad 67d, parts of the first interlayer insulating layer 69 formed over the common drain region 63d and the bit line pad 67d, but underlying the protection layer pattern 75b are not etched. Accordingly, even in the case of misalignment during the photo process for defining the first and second storage node holes 85a and 85b, the exposure of the common drain region 63d and the bit line pad 67d can be prevented.

If the step of forming the first and second storage node pads 67a and 67b is not implemented, the first and second storage node holes 85a and 85b directly expose the first and second source regions 63a and 63b respectively. At this time, the first and second gate electrodes 57a and 57b can be protected by the gate capping layer patterns 59a and 59b and the gate spacer 61.

Elements 85a and 85b correspond to elements 9a and 9b in FIG. 6.

A conformal conductive layer 87 for a storage node is then deposited on the sacrificial insulating layer 83 and in the storage node holes 85a and 85b. The storage node conductive layer 87 may be made, for example, of doped polysilicon.

Figure 12A:
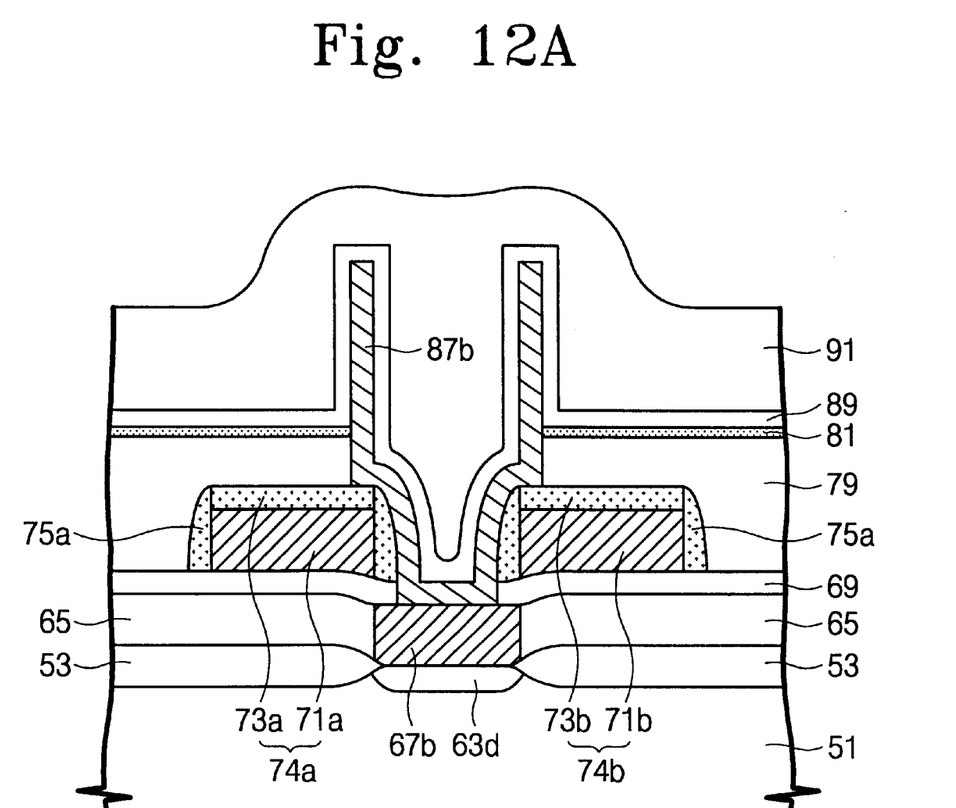
Figure 12B:
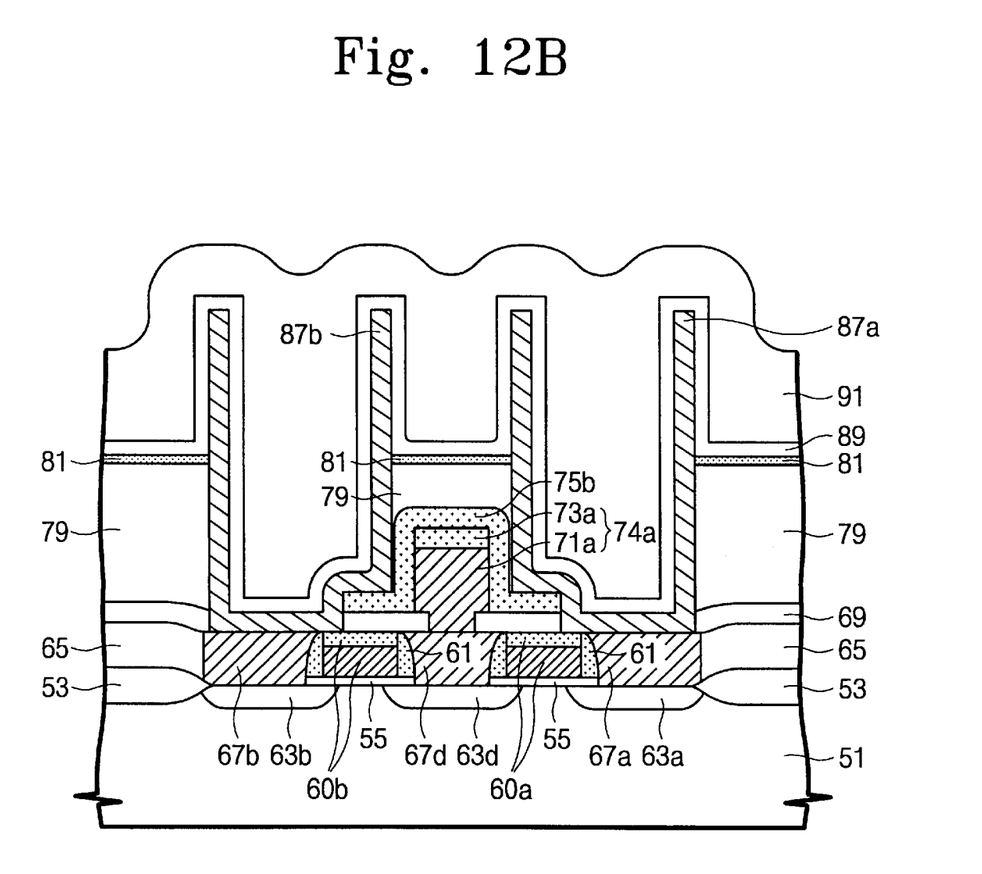

A planarized insulating layer is then formed on the storage node conductive layer 87 to fill the storage node holes 85a and 85b. The planarized insulating layer may comprise a photoresist layer or an oxide layer that has a good step coverage, such as a CVD oxide layer. A blanket etching process is then carried out on the planarized insulating layer and the storage node conductive layer until a top surface of the sacrificial insulating layer 83 is exposed, thus forming first and second storage nodes 87a and 87b in the first and second storage node holes 85a and 85b (refer to FIG. 12).

The exposed sacrificial insulating layer 83 and the remainder of the planarized insulating layer within the first and second storage nodes 87a and 87b are removed to expose inner and outer walls of the storage nodes 87a and 87b. At this time, the second interlayer insulating layer 79 is not etched because of the presence of the etching stopper layer 81. After that, a dielectric layer 89 and a plate electrode 91 are sequentially formed on the second interlayer insulating layer 79 and on the storage nodes 87a and 87b, as shown in FIGS. 12A and 12B.

Figure 13:
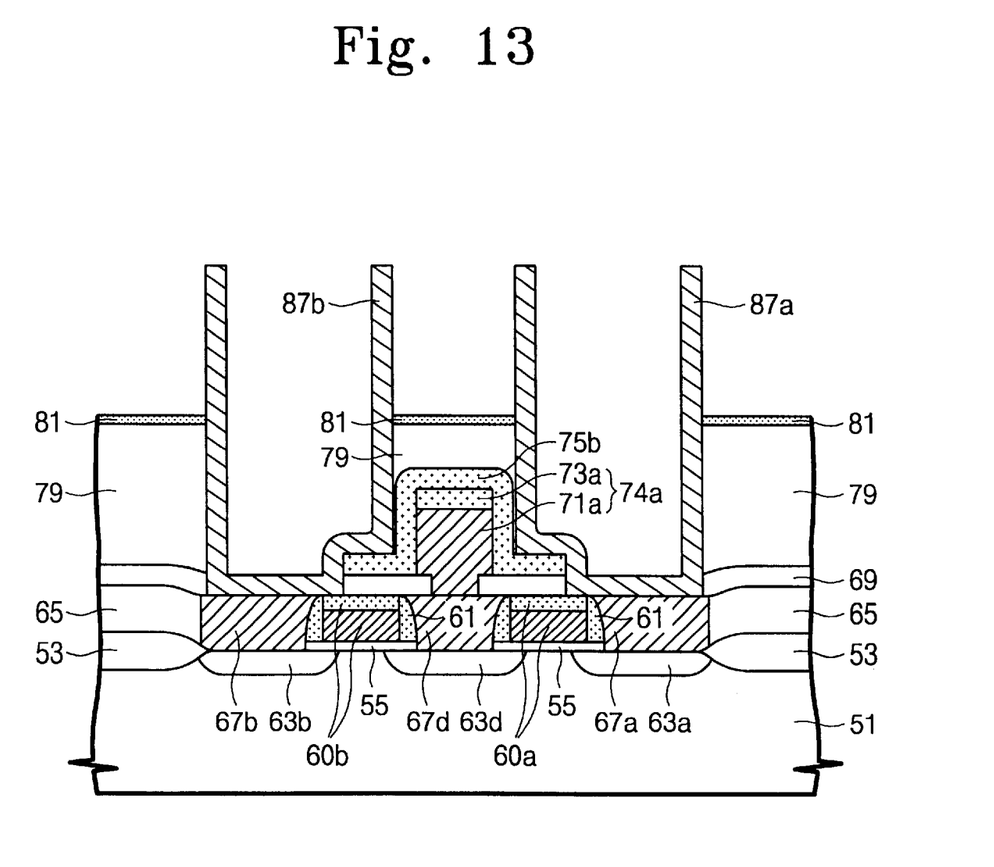
FIG. 13 schematically shows a DRAM cell in accordance with a preferred embodiment of the present invention.

FIG. 13 is a schematic cross-sectional view of a DRAM cell that is fabricated by above-mentioned method, taken along line II—II' of FIG. 6. Referring to FIG. 13, an active region is defined on a predetermined portion of a semiconductor substrate 51 by a device isolation layer 53. Adjacent first and second gate patterns 60a and 60b are disposed on the active region. A common drain region 63d is formed at the active region between the adjacent gate patterns 60a and 60b. Source regions 63a and 63b are defined on the active regions outside of the common drain region 60d. More particularly, a first source region 63a is formed at the active region outside of the first gate pattern 60a, and a second source region 63b is formed at the active region outside of the second gate pattern 60b.

The common drain region 63d, the first source region 63a, and the first gate pattern 60a together comprise a first access transistor. Similarly, the common drain region 63d, the second source region 63b, and the second gate pattern 60b together comprise a second access transistor. Each gate pattern 60a and 60b is electrically insulated to the underlying substrate 51 by a gate oxide 55. Also, each gate pattern 60a and 60b comprises a stacked layer of a gate electrode and a gate capping layer. The gate capping layer preferably comprises a material that has an etching selectivity with respect to silicon oxide, such as silicon nitride. Furthermore, each of the gate patterns 60a and 60b further comprises a gate spacer 61 on its sidewalls. Preferably, the gate spacer 61 comprises the same material as the gate capping layer, i.e., silicon nitride. Accordingly, the gate electrode is covered with the gate capping layer and gate spacer.

An insulating layer 65, having optional conductive pads 67a, 67b, and 67d, is disposed on the device isolation region 53. More particularly, a bit line pad 67d is disposed on the common drain region 63d between adjacent access transistors, a first storage node pad 67a is disposed on the first source region 63a, and a second storage node pad 67b is disposed on the second source region 63b. First and second interlayer insulating layers 69 and 79 and an etching stopper layer 81 are sequentially stacked on the insulating layer 65.

The first and second interlayer insulating layers 69 and 79 and an etching stopper layer 81 have first and second storage node holes exposing the first and second storage node pads 67a and 67b, respectively. In the absence of the optional first and second storage node pads 67a and 67b, the first and second storage node holes penetrate to the insulating layer 65 and extend downward to the first and second source regions 63a and 63b respectively.

First and second storage nodes 87a and 87b are disposed in the first and second storage node holes respectively. The first and second storage nodes 87a and 87b are electrically connected to the first and second storage node pads 67a and 67b, respectively. The first and second storage nodes can be of a cylindrical type, as shown in FIG. 13. The first and second storage nodes 87a and 87b preferably are higher than the surface of the etching stopper layer 81. In the absence of the optional first and second storage node pads 67a and 67b, the first and second storage nodes 87a and 87b directly contact with the first and second source regions 63a and 63b, respectively.

A protection layer pattern 75b is disposed between the first and second interlayer insulating layers 69 and 79 and is aligned over the common drain region 63d. The protection layer pattern 75b preferably comprises a material that has an etching selectivity with respect to the first and second interlayer insulating layer 69 and 79, such as silicon nitride. Accordingly, the protection layer pattern 75b can be disposed between the common drain region 63d and the storage nodes. As a result of this, the common drain region 63d can be protected by the protection layer pattern 75b even if there is a misalignment during the photo process for defining the first and second storage node holes.

A bit line pattern 74a is disposed under the protection layer pattern 75b and on the first insulating layer 69 to be electrically connected to the bit line pad 67d via a bit line contact hole in the first interlayer insulating layer 69. In the absence of the optional bit line pad 67d, the bit line pattern 74a is directly connected to the common drain region 63d. The bit line pattern 74a preferably comprises a stacked layer of a bit line 71a and a bit line capping layer 73a. The bit line 71a comprises a refractory metal silicide. The bit line capping layer 73a comprises a material that has an etching selectivity with respect to silicon oxide, such as silicon nitride.

As described above, the DRAM cell of the current invention includes the protection layer pattern 75b over the common drain region 63d. Furthermore, the protection layer pattern 75b completely covers the bit line pattern 74a, which is electrically connected to the common drain region 63d. Accordingly, the respective storage nodes 87a and 87b and the common drain region 63d can be advantageously separated both spatially and electrically.

The present invention may, however, be embodied in different forms and should not be construed as limited to the embodiment set forth above. Rather, this embodiment is provided so that this disclosure will be thorough and complete, and will fully convey the scope of the invention to those skilled in the art. For example, the first and second storage nodes can be a box-type nodes completely filling the node holes. In addition, an HSG silicon layer may also be formed on the surfaces of the storage nodes.

What is claimed is:

1. A DRAM cell of a semiconductor device, comprising:
    first and second access transistors formed on a semiconductor substrate, the first and second access transistors sharing a common drain region and having first and second source regions respectively;
    first and second storage nodes electrically connected to the first and second source regions respectively;
    a bit line pad formed on the common drain region;
    a protection layer pattern disposed between the common drain region and the first and second storage nodes, the protection layer pattern completely covering the common drain region;
    a bit line pattern disposed between the bit line pad and the protection layer pattern being electrically connected to the bit line pad; and
    sidewall spacers on sidewalls of the bit line pattern exposed by the protection layer.

2. A DRAM cell of a semiconductor device, as recited in claim 1, further comprising:
    a first storage node pad formed over the first source region; and
    a second storage node pad formed over the second source region,
    wherein the first and second storage node pads are electrically connected to the first and second source regions, respectively.

3. A DRAM cell of a semiconductor device, as recited in claim 2, wherein the first and second access transistors have respective first and second gate patterns, and wherein the protection layer pattern is extended to cover not only a part of the bit line pattern over the common drain region, but also a part of the first and second gate patterns of the first and second access transistors adjacent to the common drain region.

4. A DRAM cell of a semiconductor device, as recited in claim 1, wherein the first and second access transistors have respective first and second gate patterns, and further comprising a first interlayer insulating layer disposed between the protection layer pattern and the first and second gate patterns of the first and second access transistors, respectively.

5. A DRAM cell of a semiconductor device, as recited in claim 4, wherein the protection layer pattern has an etching selectivity with respect to the first interlayer insulating layer.

6. A DRAM cell of a semiconductor device, as recited in claim 5, wherein the first interlayer insulating layer comprises silicon oxide and the protection layer pattern comprises silicon nitride.

7. A DRAM cell of a semiconductor device, comprising:
    first and second access transistors formed on a semiconductor substrate, the first and second access transistors sharing a common drain region and having first and second source regions respectively;
    first and second storage nodes electrically connected to the first and second source regions respectively;
    a bit line pad disposed on, and electrically connected to, the common drain region;
    a bit line pattern disposed on, and electrically connected to, the bit line pad;
    a protection layer pattern disposed between the common drain region and the first and second storage nodes, the protection layer pattern completely covering the common drain region and exposing a portion of a top surface and sidewalls of the bit line pattern; and
    sidewall spacers on the sidewalls of the bit line pattern exposed by the protection layer.

8. A DRAM cell according to claim 7, wherein the first and second access transistors have respective first and second gate patterns, and wherein the protection layer pattern is extended to cover not only a part of the bit line pattern over the common drain region, but also a part of the first and second gate patterns of the first and second access transistors adjacent to the common drain region.

9. A DRAM cell according to claim 7, wherein the first and second access transistors have respective first and second gate patterns, and further comprising a first interlayer insulating layer disposed between the protection layer pattern and the first and second gate patterns of the first and second access transistors, respectively.

10. A DRAM cell according to claim 9, wherein the protection layer pattern has an etching selectivity with respect to the first interlayer insulating layer.

11. A DRAM cell according to claim 10, wherein the first interlayer insulating layer comprises silicon oxide and the protection layer pattern comprises silicon nitride.

* * * * *